United States Patent
Losee et al.

(10) Patent No.: US 10,347,489 B2
(45) Date of Patent: Jul. 9, 2019

(54) SEMICONDUCTOR DEVICES AND METHODS OF MANUFACTURE

(71) Applicant: General Electric Company, Schenectady, NY (US)

(72) Inventors: Peter Almern Losee, Clifton Park, NY (US); Alexander Viktorovich Bolotnikov, Niskayuna, NY (US); Stacey Joy Kennerly, Colonie, NY (US)

(73) Assignee: GENERAL ELECTRIC COMPANY, Schenectady, NY (US)

(*) Notice: Subject to any disclaimer, the term of this patent is extended or adjusted under 35 U.S.C. 154(b) by 0 days.

(21) Appl. No.: 13/933,366

(22) Filed: Jul. 2, 2013

(65) Prior Publication Data

US 2015/0008446 A1    Jan. 8, 2015

(51) Int. Cl.
*H01L 21/04*    (2006.01)
*H01L 29/16*    (2006.01)
(Continued)

(52) U.S. Cl.
CPC ........ *H01L 21/046* (2013.01); *H01L 29/0615* (2013.01); *H01L 29/0619* (2013.01);
(Continued)

(58) Field of Classification Search
CPC ........... H01L 29/1608; H01L 29/66068; H01L 29/1602; H01L 29/7802; H01L 29/6606; H01L 21/046
(Continued)

(56) References Cited

U.S. PATENT DOCUMENTS

| 4,573,066 A | 2/1986 | Whight |
| 6,002,159 A | 12/1999 | Bakowski et al. |

(Continued)

FOREIGN PATENT DOCUMENTS

| JP | S59-110164 A | 6/1984 |
| JP | 2008-010506 A | 1/2008 |

(Continued)

OTHER PUBLICATIONS

Hallén et al., "Advances in selective doping of SiC via ion implantation" Advances in Silicon Carbide Processing and Applications, Issue Date: Jun. 2004, Chapter-4,ISBN 1-58053-740-5, 46 Pages.

(Continued)

*Primary Examiner* — Eric A. Ward
*Assistant Examiner* — Eric K Ashbahian
(74) *Attorney, Agent, or Firm* — Fletcher Yoder, P.C.

(57) ABSTRACT

A method of manufacturing a semiconductor device is presented. The method includes providing a semiconductor layer comprising silicon carbide, wherein the semiconductor layer comprises a first region doped with a first dopant type. The method further includes implanting the semiconductor layer with a second dopant type using a single implantation mask and a substantially similar implantation dose to form a second region and a junction termination extension (JTE) in the semiconductor layer, wherein the implantation dose is in a range from about $2\times10^{13}$ cm$^{-2}$ to about $12\times10^{13}$ cm$^{-2}$. Semiconductor devices are also presented.

20 Claims, 3 Drawing Sheets

(51) Int. Cl.
*H01L 29/66* (2006.01)
*H01L 29/739* (2006.01)
*H01L 29/78* (2006.01)
*H01L 29/06* (2006.01)
*H01L 29/74* (2006.01)

(52) U.S. Cl.
CPC .... *H01L 29/1608* (2013.01); *H01L 29/66068* (2013.01); *H01L 29/7395* (2013.01); *H01L 29/7811* (2013.01); *H01L 29/74* (2013.01)

(58) Field of Classification Search
USPC .......................................................... 257/77
See application file for complete search history.

(56) References Cited

U.S. PATENT DOCUMENTS

| | | | |
|---|---|---|---|
| 6,040,237 A | 3/2000 | Bakowski et al. | |
| 6,927,153 B2 | 8/2005 | Raisanen et al. | |
| 6,956,238 B2 | 10/2005 | Ryu et al. | |
| 7,033,950 B2 | 4/2006 | Merrett et al. | |
| 7,800,196 B2 | 9/2010 | Veliadis et al. | |
| 7,855,415 B2 | 12/2010 | Challa et al. | |
| 8,258,052 B2 | 9/2012 | Okuno et al. | |
| 8,377,812 B2 | 2/2013 | Matocha et al. | |
| 8,866,158 B2 | 10/2014 | Hamada et al. | |
| 2006/0118792 A1 | 6/2006 | Ryu et al. | |
| 2009/0227095 A1* | 9/2009 | Bateman | H01L 31/1804 438/514 |
| 2010/0044825 A1* | 2/2010 | Schmidt | 257/493 |
| 2010/0289032 A1* | 11/2010 | Zhang | H01L 21/0465 257/77 |
| 2011/0195563 A1* | 8/2011 | Okuno | H01L 21/0465 438/518 |
| 2012/0132924 A1 | 5/2012 | Tarui et al. | |
| 2012/0256192 A1 | 10/2012 | Zhang et al. | |
| 2013/0045593 A1 | 2/2013 | Ooi | |
| 2013/0105933 A1 | 5/2013 | Sato | |
| 2013/0214291 A1* | 8/2013 | Uchida et al. | 257/77 |
| 2013/0248981 A1* | 9/2013 | Okumura | H01L 29/42368 257/329 |
| 2014/0027781 A1* | 1/2014 | Ryu | H01L 29/7811 257/77 |
| 2014/0197422 A1* | 7/2014 | Wada | H01L 29/872 257/77 |
| 2014/0299887 A1* | 10/2014 | Matocha | H01L 23/26 257/77 |
| 2015/0340443 A1* | 11/2015 | Wada | H01L 29/0623 257/77 |

FOREIGN PATENT DOCUMENTS

| | | |
|---|---|---|
| WO | 2012137659 A1 | 10/2012 |
| WO | 2013/061433 A1 | 5/2013 |
| WO | 2013173414 A1 | 11/2013 |

OTHER PUBLICATIONS

Search Report and Written Opinion issued in connection with corresponding GB Application No. GB1411664.4 dated Dec. 12, 2014.

Bolotnikov et al., "Junction Termination Extension Implementing Drive-in Diffusion of Boron for High-Voltage SiC Devices", IEEE Transactions on Electron Devices, vol. No. 57, Issue No. 8, pp. 1930-1935, Aug. 2010.

Jiang et al., "A simple method to design the single-mask multizone junction termination extension for high-voltage IGBT", Proceedings of the 2012 24th International Symposium on Power Semiconductor Devices and ICs (ISPSD), pp. 173-176, 2012.

Notification of reasons for refusal issued in connection with corresponding JP Application No. 2014-135589 dated Dec. 4, 2018 (Translation is not available).

* cited by examiner

SEMICONDUCTOR DEVICES AND METHODS OF MANUFACTURE

BACKGROUND OF THE INVENTION

The invention relates generally to methods of manufacturing semiconductor devices and, more particularly, to methods of manufacturing silicon carbide-based devices that utilize a junction termination extension.

Breakdown voltage of the reverse-blocking junction typically defines the maximum reverse voltage that a semiconductor device (having a p-n junction) can withstand. Such a blocking junction may comprise, for example, a p-n junction of a thyristor, a junction barrier schottky (JBS) diode, a bipolar junction transistor (BJT), an insulated-gate bipolar transistor (IGBT), or a corresponding junction in a metal-oxide-semiconductor field-effect transistor (MOSFET). Usually avalanche breakdown occurs in such devices at a voltage substantially less than the ideal breakdown voltage if no termination is present, because excessively high electric fields are present at certain locations ("high field points") in the device under reverse bias. A high field point of a blocking junction under reverse bias usually occurs at locations where p-n junction is no longer planar, e.g. at a region of curvature, such as that at the periphery or edges of device active area.

In particular, breakdown voltage is critical for high power devices, such as silicon carbide (SiC) devices. Also, properties, such as insensitivity of device design (including termination) to active dose and interface charge variation, are more substantial in SiC devices, than in silicon (Si) based devices due to fundamental structural material differences.

Semiconductor devices may utilize any of various structures and methods to achieve an increase in the breakdown voltage. For example, junction termination extension (JTE) regions may be utilized near edge portions of the p-n junction formed by active area of device. In general, a JTE region may be considered as a more lightly doped extension of a heavily doped semiconductor region that adjoins a lightly doped semiconductor region having opposite type of conductivity to form the foregoing p-n junction. The principal function of the JTE region is to reduce the high concentration of electric field that would otherwise exist in the vicinity of the unterminated portion of the p-n junction, by laterally extending the blocking junction.

In addition to breakdown voltage, the design of the JTE affects a number of critical properties of the semiconductor device, including reliability and surface charge variation tolerance, and many of the affected properties have complex interrelationships. However, typical methods of manufacturing semiconductor devices include multiple implantation steps performed sequentially, which leads to higher implant costs.

Accordingly, there is a need for improved methods of manufacturing semiconductor devices including a JTE design. Further, it may be desirable to provide a JTE design that improves the critical properties of silicon-carbide based semiconductor devices, such as breakdown voltage, charge tolerance to surface charge variation and reliability.

BRIEF DESCRIPTION OF THE INVENTION

One embodiment is directed to a method of manufacturing a semiconductor device. The method comprises providing a semiconductor layer comprising silicon carbide, wherein the semiconductor layer comprises a first region doped with a first dopant type. The method further comprises implanting the semiconductor layer with a second dopant type using a single implantation mask and a substantially similar implantation dose to form a second region and a junction termination extension (JTE) in the semiconductor layer, wherein the implantation dose is in a range from about $2 \times 10^{13}$ cm$^{-2}$ to about $12 \times 10^{13}$ cm$^{-2}$.

Another embodiment is directed to a semiconductor device. The semiconductor device comprises a substrate and a semiconductor layer comprising silicon carbide disposed on the substrate. The semiconductor layer comprises a first region, a second region, and a junction termination extension (JTE), wherein the first region is doped with a first dopant type to have a first conductivity type, and the second region and the JTE are doped with a second dopant-type to have a second conductivity type. An implanted dose in the second region and the JTE is in a range from about $2 \times 10^{13}$ cm$^{-2}$ to about $12 \times 10^{13}$ cm$^{-2}$, and a dopant concentration in the second region is substantially the same as the dopant concentration in the JTE.

Another embodiment is directed to a semiconductor device. The semiconductor device comprises a substrate and a semiconductor layer comprising silicon carbide disposed on the substrate. The semiconductor layer comprises a first region, a second region, and a junction termination extension (JTE), wherein the first region is doped with a first dopant type to have a first conductivity type, and the second region and the JTE are doped with a second dopant-type to have a second conductivity type. An implanted dose in the second region and the JTE is in a range from about $2 \times 10^{13}$ cm$^{-2}$ to about $7.5 \times 10^{13}$ cm$^{-2}$, and a dopant concentration in the second region is substantially the same as the dopant concentration in the JTE.

DRAWINGS

These and other features, aspects, and advantages of the present invention will become better understood when the following detailed description is read with reference to the accompanying drawings, in which like characters represent like parts throughout the drawings, wherein.

DETAILED DESCRIPTION

As discussed in detail below, some of the embodiments of the invention include methods of making silicon carbide (SiC) semiconductor devices including a junction termination extension (JTE).

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components (for example, a region) being present and includes instances in which a combination of the referenced components may be present, unless the context clearly dictates otherwise.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise.

As used herein, the term "disposed on" refers to layers disposed directly in contact with each other or indirectly by having intervening layers there between, unless otherwise specifically indicated. The term "adjacent" as used herein means that the two layers are disposed contiguously and are in direct contact with each other.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

Figure 1:
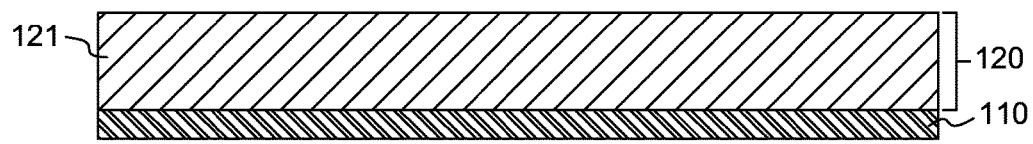
FIG. 1 is a cross-sectional view schematically demonstrating a method step of manufacturing a semiconductor device, in accordance with some embodiments of the invention.
Figure 2:
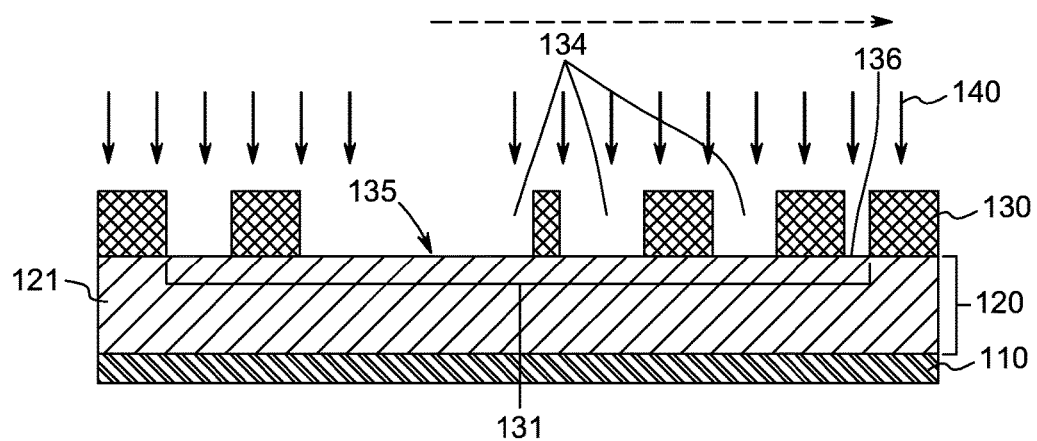
FIG. 2 is a cross-sectional view schematically demonstrating a method step of manufacturing a semiconductor device, in accordance with some embodiments of the invention.
Figure 3:
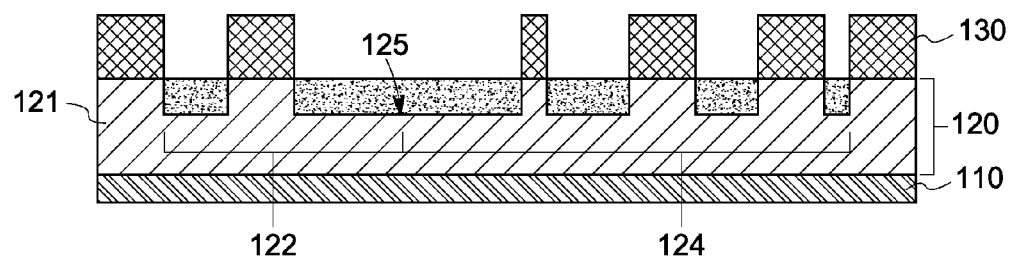
FIG. 3 is a cross-sectional view schematically demonstrating a method step of manufacturing a semiconductor device, in accordance with some embodiments of the invention.

As described in detail later, a method of manufacturing a semiconductor device is presented. FIGS. 1-3 schematically represent a method for fabricating a semiconductor device 100, in accordance with one embodiment of the invention. As indicated in FIG. 1, the method includes providing a semiconductor layer 120 including silicon carbide (SiC). The semiconductor layer includes a first region 121 doped with a first dopant type (for example, n-type dopants) such that it has a first conductivity type (for example, n-type).

In some embodiments, the semiconductor layer 120 may be further disposed on a substrate 110. The substrate 110 and the semiconductor layer 120 may be n-type or p-type. For example, the semiconductor layer may be a SiC layer of any polytype of silicon carbide, such as 3C-SiC, 4H-SiC, or 6H-SiC polytypes. The substrate 110 may comprise silicon carbide. In one embodiment, the substrate may be a heavily doped n+ SiC substrate and the SiC semiconductor layer may also be of n-type. The dopant concentration in the substrate may be in a range from about $10^{18}$ cm$^{-3}$ to about $10^{21}$ cm$^{-3}$, in some embodiments. The dopant concentration in the SiC semiconductor device layer may be in a range from about $10^{14}$ cm$^{-3}$ to about $10^{17}$ cm, in some embodiments. In some embodiments, a buffer layer (not shown) may be further disposed between the substrate 110 and the semiconductor layer 120.

The semiconductor layer 120 may be epitaxially grown over the substrate. For example, a deposition technique such as, chemical vapor deposition (CVD) may be performed to form the semiconductor layer 120. In certain embodiments, the thickness of the semiconductor layer 120 may be in a range of about 1 micron to about 200 microns.

The method further includes, as indicated in FIGS. 2 and 3, implanting the semiconductor layer 120 with a second dopant type (for example, p-type dopants) using a single implantation mask 130 and a substantially similar implantation dose 140 to form a second region 122 and a junction termination extension (JTE) 124 in the semiconductor layer 120. The term "JTE" as used herein refers to a more lightly doped extension of a more heavily doped semiconductor region (second region) that adjoins a lightly doped semiconductor region having opposite type of conductivity to form a p-n junction. One of the functions of the JTE is to reduce the high electric field that would otherwise exist in the vicinity of the unterminated portion of the p-n junction, and especially at the device active area periphery, by laterally extending the blocking junction.

The second region 122 may be referred to as a "well region" in semiconductor devices, such as, a metal-oxide-semiconductor field-effect transistor (MOSFET) or an insulated-gate bipolar transistor (IGBT). Further, in semiconductor devices, such as, a bipolar junction transistor (BJT) or a thyristor, the second region 122 may also be referred to as a "base region". For purpose of further description, the terms "well region" and "base region" are used herein interchangeably. However, it should be noted that the description below is also applicable to "base region" in the context of BJT or thyristor.

As illustrated in FIG. 3, at least a portion of the JTE is disposed within an area doped simultaneously with, and contiguous with the second region 122. This area may be referred to as a "well-termination region" and may further include the blocking junction mentioned earlier. Referring again to FIG. 3, reference numeral 125 indicates the blocking junction defined by the well region 122 in the semiconductor layer 120.

The term "single implantation mask" as used herein refers to a single mask used to provide the required dopant profile/dose in the active area (e.g. well region 122) and the required effective dose in JTE region 124. In some embodiments, the method may further include patterning the single implantation mask 130 on the semiconductor layer 120, for example, via photolithography and the dopants may be implanted into the semiconductor layer 120 using conventional ion implantation procedures (FIG. 2).

As illustrated in FIGS. 2 and 3, the single implantation mask 130 further includes a number of window regions 134 defining the well region 122 and the JTE 124 in the semiconductor layer 120. The window regions 134 are further characterized by an open window density. The term "open window density" as used herein refers to the unmasked-to-total area ratio. The term "open window density profile" as used herein refers to the open window density number as a function of laterally increasing distance from the primary blocking junction.

In some embodiments, the plurality of window regions 134 further include a region 135 defining the primary blocking junction 125 in the semiconductor layer 120, as illustrated in FIGS. 2 and 3. In such instances, the open window density of the window regions 134 decreases laterally in a direction away from the region 135 defining the primary blocking junction 125 (as indicated by an arrow in FIG. 2).

In some embodiments, an open window density of the window regions varies laterally such that an effective implanted dose varies in a range from about 80 percent of the total implanted dose at the primary blocking junction to about 10 percent of the total implanted dose at a terminal portion of the JTE, and more particularly from about 70 percent to about 10 percent.

As noted earlier, the open window density of the window regions 134 defining the JTE 124 decreases laterally. In some embodiments, the open window density of the window regions 134 varies over a range of about 90 percent at the primary blocking junction 135 to about 5 percent at a terminal portion 136 of the JTE 124. More particularly, the open window density of the window regions 134 may vary over a range of about 80 percent at the primary blocking junction 135 to about 10 percent at a terminal portion 136 of the JTE 124. Still more particularly, the open window density of the window regions 134 may vary over a range of about 70 percent at the primary blocking junction 135 to about 10 percent at a terminal portion 136 of the JTE 124.

The term "substantially similar implantation dose" as used herein means that the single implantation dose used to provide the required doping profile of the well region 122 and the JTE 124 varies by less than about 5 percent. This is in contrast to typical methods used to manufacture the well region 122 and JTE 12, wherein different implantation masks as well as different implantation doses are employed to vary the dopant concentration profile in the well region and JTE. As will be appreciated by one of ordinary skill in the art, use of two different masks and implantation doses leads to increased number of process steps and increased process cost.

In some embodiments, the implantation dose is in a range from about $2\times10^{13}$ cm$^{-2}$ to about $12\times10^{13}$ cm$^{-2}$. More particularly, the implantation dose may be in a range from about $2\times10^{13}$ cm$^{-2}$ to about $7.5\times10^{13}$ cm$^{-2}$. Still more particularly, the implantation dose may be in a range from about $2\times10^{13}$ cm$^{-2}$ to about $5\times10^{13}$ cm$^{-2}$.

As will be appreciated by one of ordinary skill in the art, the implantation step may include one or more implantation process sub-steps, where implantation may be carried out using a single implantation energy/dose or using multiple ion implantation energies/doses, in each one of the implantation process sub-steps. However, as noted earlier, the implantation is performed using a single implantation mask and a substantially similar implantation dose to form well and JTE regions.

In some embodiments, implantation of the semiconductor layer 120 with a second dopant type is performed at one or more implantation energy in a range greater than 5 keV and less than 700 keV. More particularly, implantation of the semiconductor layer 120 with a second dopant type may be performed at one or more implantation energy in a range greater than 20 keV and less than 400 keV to provide total implantation dose in the rage defined above.

The well region 122 and the JTE 124 may further include a single well structure or a number of structures, as indicated in FIG. 3. In certain embodiments, the well region 122 includes a number of discrete well structures, and the JTE 124 includes a number of JTE structures.

In certain embodiments, the JTE 124 includes a number of discrete regions that may be separated from each other (depending on effective dose in specific JTE region). The discrete regions in the JTE 124 are doped with the second dopant type (for example, p-type), such that an effective doping of the JTE decreases in a direction away from an edge of the primary blocking junction. Effective JTE doping (defined by the acceptor charge minus the donor charge in 124) may be controlled in part by varying the density of masked versus unmasked area during the implant. The effective JTE dose/doping is defined as the product of the implanted dose/doping and the spatial density of unmasked to total area ratio (open window density). The effective JTE doping can be varied along the laterally increasing distance from the primary blocking junction by altering the unmasked to total area ratio according to open window density.

As noted earlier, the semiconductor layer 120 may be doped with a first dopant type to have a first conductivity type. The well region 122 and the JTE 124 may be further doped with a second dopant type to have a second conductivity type. For example, the first and second conductivity types may be p-type and n-type. In certain embodiments, the first and second conductivity types may be n-type and p-type. In such instances, the method includes forming a p-well region and a p-doped JTE in the n-type SiC semiconductor layer. Suitable non-limiting examples of p-type dopants include boron, aluminum, gallium, magnesium, carbon, calcium, or combinations thereof. Suitable non-limiting examples of n-type dopants include nitrogen, phosphorus, arsenic, antimony, or combinations thereof.

It should be noted that the method of manufacturing a semiconductor device is applicable to a number of device types, depending on the specific doping. Thus, suitable non-limiting examples of the semiconductor device 100 include a metal-oxide-semiconductor field-effect transistor (MOSFET), an insulated-gate bipolar transistor (IGBT), a bipolar junction transistor (BJT), a thyristor, or a diode. In certain embodiments, the semiconductor device is a MOSFET.

Figure 4:
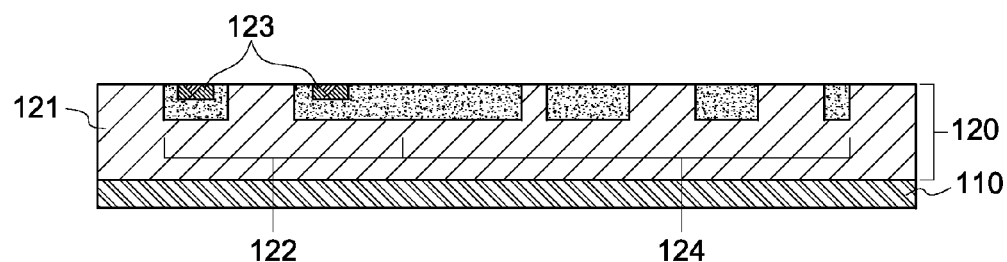
FIG. 4 is a cross-sectional view schematically demonstrating a method step of manufacturing a MOSFET, in accordance with some embodiments of the invention.

Referring now to FIGS. 4-7, a method of manufacturing a MOSFET 100 in accordance with some embodiments of the invention is presented. In such instances, the method may further include the step of removing the implantation mask 130, followed by doping the semiconductor layer to form a source region 123 having a first conductivity type (for example, n-type), as indicated in FIG. 4. The source region may be formed, for example, via photolithography and ion implantation, as contemplated earlier for other regions.

Figure 5:
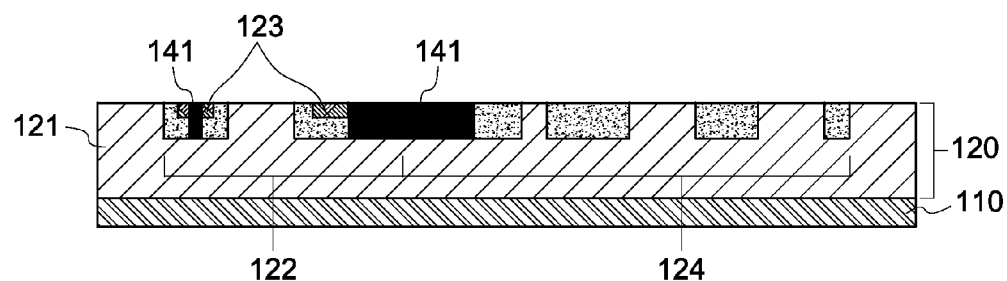
FIG. 5 is a cross-sectional view schematically demonstrating a method step of manufacturing a MOSFET, in accordance with some embodiments of the invention.
Figure 6:
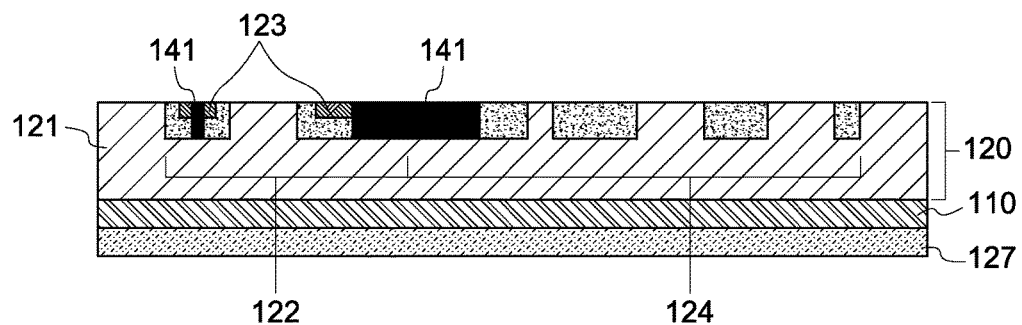
FIG. 6 is a cross-sectional view schematically demonstrating a method step of manufacturing a MOSFET, in accordance with some embodiments of the invention.

Thereafter, a base region (p+-region) 141 may be formed, as indicated in FIG. 5. A drain electrode 127 may also be formed, for example, via vapor deposition and/or electroplating in contact with a surface of the substrate 110 opposite to the surface in contact with the semiconductor layer 120 (FIG. 6).

Figure 7:
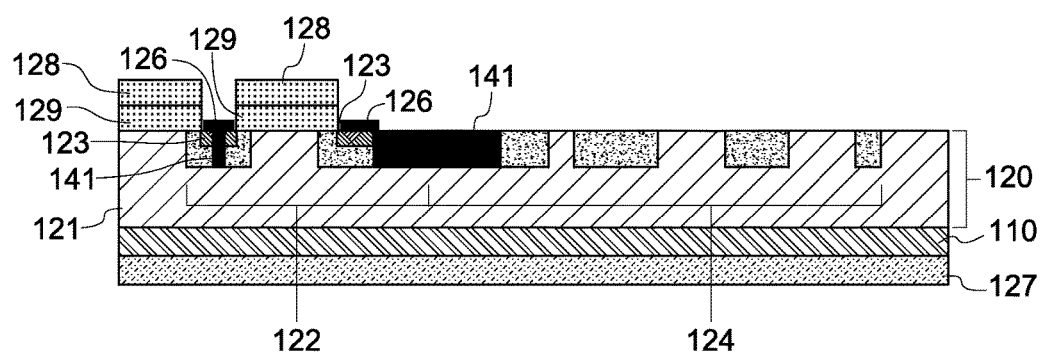
FIG. 7 is a cross-sectional view schematically demonstrating a method step of manufacturing a MOSFET, in accordance with some embodiments of the invention.

A gate electrode 128 may also be formed on the semiconductor layer, by first disposing an insulator layer 129 on the semiconductor layer 120, followed by forming the gate electrode 128 on the insulation layer 129 (FIG. 7). Suitable non-limiting example of the insulation layer 129 material may include silicon dioxide. A source electrode 126 may be formed in contact with the source region 123, for example, via vapor deposition and/or electroplating (FIG. 5).

As noted earlier, conventional methods of forming p-well and JTE include different mask sequences and implantation steps. Methods in accordance with some embodiments of the invention allow for use of a single implantation mask and a substantially similar implantation dose to form the well region and JTE simultaneously. Thus, the process steps for well and JTE formation may be merged, which could simplify the overall process flow and save implantation and processing costs.

Further, unlike in Si-based semiconductor devices, merging the JTE implantation with well/base region implantation into a single profile or process step in SiC semiconductor devices is more complex due to a number of material and technological factors. In SiC power MOSFETs, the inversion channel mobility is much lower than in conventional Si MOSFETs. To lower the conduction losses, SiC MOSFETS are typically designed with very short channels, e.g., less than 0.7 μm. Therefore, in order to hold off premature punchthrough or drain-induced-barrier-lowering limited breakdown, a larger implanted dose than the critical dose is used to form the well regions. Also, since dopants in SiC diffuse very slowly and require very high temperatures, ion implantation is the preferred method of forming well regions. Conventional ion implantation equipment are limited to energies such that the resulting junction depths are on the order of xj=1 μm or less. This further drives up the required well concentration to hold off punchthrough and obtain sufficiently low spreading resistances under the source region. The resulting optimum well/base region implanted doses tend to be multiple times larger than $Q_C$ (defined by $Q_C=\varepsilon_S E_C$, where $\varepsilon_S$ is the dielectric constant and Ec is the critical field) in SiC devices. An example SiC MOSFET well region may be implanted with a dose of $5\times10^{13}$ cm$^{-2}$ whereas the optimal JTE implanted dose may be $1$-$2\times10^{13}$ cm$^{-2}$. Embodiments of the present invention allow for both optimized SiC well regions and JTE regions with the same implanted dose, while using conventional ion implant technologies which are lower cost and typically higher volume capability.

Figure 8:
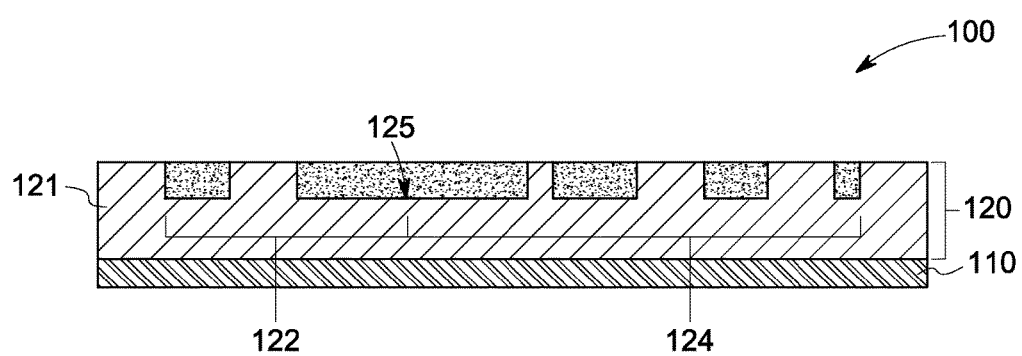
FIG. 8 is a cross-sectional view of a semiconductor device, in accordance with some embodiments of the invention.

In one embodiment, a semiconductor device is presented. FIG. 8 illustrates a semiconductor device 100, in accordance with one embodiment of the invention. The semiconductor device 100 includes a substrate 110 and a semiconductor layer 120 comprising silicon carbide disposed on the substrate 110. As illustrated in FIG. 3, the semiconductor layer 120 includes a first region 121, a second region 122, and a JTE 124. The first region 121 is doped with a first dopant type to have a first conductivity type. The second region 122 and the JTE 124 are doped with a second dopant-type to have a second conductivity type.

In some embodiments, the first dopant type is p-type, and the second dopant type is n-type. In other embodiments, the first dopant type is n-type, and the second dopant type is p-type. In such instances, the semiconductor includes a p-type second region 122 (also referred to as p-well region) and a p-type JTE 124 in a semiconductor layer 120.

The second region 122 and the JTE 124 are further characterized by an implanted dose and a dopant concentration. The term implanted dose as used herein refers to an amount of dopant that is implanted in the second region, and is differentiated from the term "implantation dose" that refers to the dose used for implantation. The term "implanted dose" as used herein refers to the integrated concentration of dopant from a surface of the semiconductor layer to the metallurgical junction.

In some embodiments, an implanted dose in the second region and the JTE is in a range from about $2\times10^{13}$ cm$^{-2}$ to about $12\times10^{13}$ cm$^{-2}$. More particularly, the implanted dose may be in a range from about $2\times10^{13}$ cm$^{-2}$ to about $7.5\times10^{13}$ cm$^{-2}$. Still more particularly, the implanted dose may be in a range from about $2\times10^{13}$ cm$^{-2}$ to about $5\times10^{13}$ cm$^{-2}$. Further, the dopant concentration at a given point location in the second region is substantially the same as the dopant concentration at a given point location in the JTE.

As noted earlier, suitable non-limiting examples of the semiconductor device 100 include a metal-oxide-semiconductor field-effect transistor (MOSFET), an insulated-gate bipolar transistor (IGBT), a bipolar junction transistor (BJT), a thyristor, or a diode. In certain embodiments, the semiconductor device is a MOSFET. In certain embodiments, the semiconductor device is an IGBT.

Referring again to FIG. 7, a MOSFET 100 in accordance with some embodiments of the invention is illustrated. The MOSFET 100 includes a substrate 110 and a semiconductor layer 120 disposed on the substrate 110. The MOSFET 100 further includes a gate electrode 128 disposed on a surface of the semiconductor layer 120. For example, the gate electrode 128 may be disposed on an insulator 129, which is in direct contact with the semiconductor layer 120, as indicated in FIG. 7. The MOSFET 100 further includes a drain electrode 127 disposed adjacent to a surface of the substrate 110 that is opposite the surface on which the semiconductor layer 120 is disposed.

Further, as illustrated in FIG. 7, the semiconductor layer 120 includes a first region 121 having a first conductivity type (for example, n-type); and a second region 122 (for example, well region) and JTE 124 having a conductivity of a second type (for example, p-type). The MOSFET 100 further includes a source region 123 of first conductivity type (for example n-type) in contact with a source electrode 126.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A method of manufacturing a metal-oxide gated transistor device, the method comprising:
providing a semiconductor layer comprising silicon carbide, wherein the semiconductor layer comprises a first region doped with an n-type dopant;

implanting the semiconductor layer with a p-type dopant using a single implantation mask and a substantially similar implantation dose including one or more implantation process sub-steps to simultaneously form a p-well region comprising a channel region, and a junction termination extension (JTE) of the metal-oxide gated transistor device in the semiconductor layer; wherein the implantation dose is in a range from about $2\times10^{13}$ cm$^2$ to about $12\times10^{13}$ cm$^{-2}$, and wherein a dopant concentration in the p-well region is substantially the same as the dopant concentration in the JTE; and forming a p+-region in the semiconductor layer after the step of forming the p-well region and the JTE such that the p-well region is connected to the JTE via the p+-region, wherein the single implantation mask has a variable open window density that varies as a function of laterally increasing distance from a primary blocking junction of the semiconductor layer to the JTE.

2. The method of claim 1, wherein the window regions further comprise a region defining the primary blocking junction in the semiconductor layer, and wherein the variable open window density of the window regions decreases laterally in a direction away from the region defining the primary blocking junction.

3. The method of claim 2, wherein an open window density at the region defining the primary blocking junction is less than 80 percent.

4. The method of claim 2, wherein the variable open window density of the window regions varies laterally such that an effective implanted dose varies in a range from about 80 percent at the primary blocking junction to about 10 percent of the total implanted dose at a terminal portion of the JTE.

5. The method of claim 2, wherein an open window density of the window regions varies laterally such that an effective implanted dose varies in a range from about 70 percent at the primary blocking junction to about 10 percent of the total implanted dose at a terminal portion of the JTE.

6. The method of claim 1, wherein the implantation dose is in a range from about $2\times10^{13}$ cm$^{-2}$ to about $7.5\times10^{13}$ cm$^{-2}$.

7. The method of claim 1, wherein the implantation dose is in a range from about $2\times10^{13}$ cm$^{-2}$ to about $5\times10^{13}$ cm$^{-2}$.

8. The method of claim 1, wherein implanting the semiconductor layer with the p-type dopant is performed at one or more implantation energy in a range greater than 5 keV and less than 700 keV.

9. The method of claim 1, wherein the JTE comprises a plurality of discrete regions that are separated from each other, and wherein the discrete regions in the JTE are doped with the p-type dopant, such that an effective doping profile of the JTE decreases in a direction away from an edge of the primary blocking junction.

10. The method of claim 1, wherein the semiconductor device is a metal-oxide-semiconductor field-effect transistor (MOSFET).

11. The method of claim 1, wherein the semiconductor device is an insulated-gate bipolar transistor (IGBT).

12. The method of claim 1, wherein a single implantation dose is used in each one of the implantation process sub-steps.

13. A metal-oxide gated transistor device comprising:
a silicon carbide (SiC) substrate;
a semiconductor layer comprising silicon carbide disposed on the substrate, wherein the semiconductor layer comprises a first region, a p-well region including a channel of the metal-oxide gated transistor device, a p+-region, and a junction termination extension (JTE);
wherein the first region is doped with an n-type dopant to have n-type conductivity, and the p-well region and the JTE are doped with a p-type dopant to have a p-type conductivity, and the p-well region is connected to the JTE via the p+-region;
wherein an implanted dose in the p-well region and the JTE is in a range from about $2\times10^{13}$ cm$^{-2}$ to about $12\times10^{13}$ cm$^{-2}$; and
wherein a dopant concentration in the p-well region is substantially the same as the dopant concentration in the JTE.

14. The metal-oxide gated transistor device of claim 13, wherein the JTE comprises a plurality of discrete regions that are separated from each other, and wherein the discrete regions in the JTE are doped with the p-type dopant, such that an effective doping profile of the JTE decreases in a direction away from an edge of a primary blocking junction of the semiconductor layer.

15. The metal-oxide gated transistor device of claim 13, wherein the semiconductor device is a metal-oxide-semiconductor field-effect transistor (MOSFET).

16. The metal-oxide gated transistor device of claim 13, wherein the channel has a length less than 0.7 μm.

17. A metal-oxide gated transistor device, comprising:
a substrate,
a semiconductor layer comprising silicon carbide disposed on the substrate, wherein the semiconductor layer comprises a first region, a p-well region including a channel of the metal-oxide gated transistor device, and a junction termination extension (JTE);
wherein the first region is doped with an n-type dopant to have n-type conductivity, and the p-well region and the JTE are doped with a p-type dopant to have a p-type conductivity, and the p-well region is connected to the JTE via a p+-region;
wherein an implanted dose in the p-well region and the JTE is in a range from about $2\times10^{13}$ cm$^{-2}$ to about $7.5\times10^{13}$ cm$^{-2}$; and
wherein a dopant concentration in the p-well region is substantially the same as the dopant concentration in the JTE.

18. The metal-oxide gated transistor device of claim 17, wherein the JTE comprises a plurality of discrete regions that are separated from each other, and wherein the plurality of discrete regions in the JTE are doped with the p-type dopant, such that an effective doping profile of the JTE decreases in a direction away from an edge of a primary blocking junction of the semiconductor layer.

19. The metal-oxide gated transistor device of claim 17, wherein the semiconductor device is a metal-oxide-semiconductor field-effect transistor (MOSFET).

20. The metal-oxide gated transistor device of claim 17, wherein the channel has a length less than 0.7 μm.

* * * * *